(12) United States Patent
Chase et al.

(10) Patent No.: US 6,500,348 B2
(45) Date of Patent: Dec. 31, 2002

(54) DEEP REACTIVE ION ETCHING PROCESS AND MICROELECTROMECHANICAL DEVICES FORMED THEREBY

(75) Inventors: Troy A. Chase, Kokomo, IN (US); John C. Christenson, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 47 days.

(21) Appl. No.: 09/782,394

(22) Filed: Feb. 14, 2001

(65) Prior Publication Data

US 2002/0111031 A1 Aug. 15, 2002

(51) Int. Cl.⁷ .............................. H01L 21/00; B44C 1/22
(52) U.S. Cl. ............................. 216/2; 73/488; 216/79; 438/712; 438/719; 438/723; 438/739
(58) Field of Search ................................. 438/712–719, 438/723–735, 738, 739–743; 216/2, 67–79; 257/417; 73/488, 504.15, 514.01

(56) References Cited

U.S. PATENT DOCUMENTS

| | | | |
|---|---|---|---|
| 5,450,751 A | 9/1995 | Putty et al. | 73/504.18 |
| 5,547,093 A | 8/1996 | Sparks | 216/2 |
| 5,846,849 A | * 12/1998 | Shaw et al. | 438/739 |
| 5,872,313 A | 2/1999 | Zarabadi et al. | 73/497 |
| 5,922,212 A | * 7/1999 | Kano et al. | 438/723 X |
| 6,127,273 A | 10/2000 | Laermet et al. | 438/709 |

OTHER PUBLICATIONS

U.S. patent application Ser. No. 09/410712, filed Oct. 1, 1999.

Research Disclosure, Jun. 1999 No. 42271, p. 828.

* cited by examiner

*Primary Examiner*—William A. Powell
(74) *Attorney, Agent, or Firm*—Jimmy L. Funke

(57) ABSTRACT

A process for forming a microelectromechanical system (MEMS) device by a deep reactive ion etching (DRIE) process during which a substrate overlying a cavity is etched to form trenches that breach the cavity to delineate suspended structures. In order to eliminate or at least reduce heat and/or charge accumulation that accelerates the DRIE etch rate of certain suspended structures, means are provided to electrically and/or thermally tie the suspended structures to each other and/or the surrounding bulk substrate. As a result, the process window is increased to allow slower-etching structures to be etched to completion without overetching the more rapidly-etched structures.

34 Claims, 4 Drawing Sheets

DEEP REACTIVE ION ETCHING PROCESS AND MICROELECTROMECHANICAL DEVICES FORMED THEREBY

TECHNICAL FIELD

The present invention generally relates to micromachined devices, and particularly microelectromechanical system (MEMS) devices formed by deep reactive ion etching (DRIE) processes. More particularly, this invention relates to structures and methods for improving yields and device reliability of MEMS devices formed by DRIE processes.

BACKGROUND OF THE INVENTION

A wide variety of MEMS devices are known, including accelerometers, rate sensors, actuators, motors, microfluidic mixing devices, springs for optical-moving mirrors, etc. As an example, rotational accelerometers that employ MEMS devices are widely used in computer disk drive read/write heads to compensate for the effects of vibration and shock. Other applications for rotational accelerometers that use MEMS devices include VCR cameras and aerospace and automotive safety control systems and navigational systems. Rotational rate sensors and accelerometers have been developed whose MEMS devices are fabricated in a semiconductor chip. Notable examples of rotational rate sensors include a plated metal sensing ring disclosed in U.S. Pat. No. 5,450,751 to Putty et al., and electrically-conductive, micromachined silicon sensing rings disclosed in U.S. Pat. No. 5,547,093 to Sparks and U.S. Pat. No. 5,872,313 to Zarabadi et al., all of which are assigned to the assignee of this invention. U.S. Pat. No. 6,257,062 to Rich, also assigned to the assignee of this invention and incorporated herein by reference, discloses a MEMS device that employs a disk-shaped semiconductor proof mass for sensing rotational acceleration. Rich's proof mass is suspended above a cavity by a number of tethers that extend from the perimeter of the proof mass to the rim of a substrate surrounding the proof mass. The tethers allow the proof mass to rotate about an axis perpendicular to the plane containing the proof mass and tethers. Fingers extend radially outward from the proof mass and are interdigitized with fingers extending radially inward from the substrate rim. Pairs of the cantilevered fingers of the proof mass and rim are capacitively coupled to produce an output signal that varies as a function of the distances between adjacent paired fingers, which in turn vary with the angular position of the proof mass as it rotates about its axis of rotation.

Sensors of the type described above are capable of extremely precise measurements, and are therefore desirable for use in a wide variety of applications. However, the intricate proof masses and associated sensing structures required for such sensors must be precisely formed in order to ensure the proper operation of the sensor. For example, Rich's device requires a sufficient gap between paired interdigitized fingers to prevent stiction and shorting, yet paired fingers must also be sufficiently close to produce a sufficient capacitive output signal for the sensor. Increasing the area of the fingers to achieve greater capacitive coupling increases the capacitive output for a given finger gap. However, traditional etching techniques have not generally been well suited for mass-producing semiconductor micromachines with high aspect ratios necessary to etch closely-spaced fingers in a relatively thick substrate. For example, with conventional etching techniques it is difficult to achieve a 10:1 aspect ratio capable of forming interdigitized fingers spaced three micrometers apart in a silicon layer that is thirty micrometers thick. In addition to operational considerations, there is a continuing emphasis for MEMS devices that are lower in cost, which is strongly impacted by process yield, yet exhibit high reliability and performance capability. Consequently, improvements in the processing of MEMS devices for sensing and other applications are highly desirable.

Deep reactive ion etching (DRIE) is a known process capable of performing deep, high aspect ratio anisotropic etches of silicon and polysilicon, and is therefore desirable for producing semiconductor MEMS of the type taught by Rich. However, DRIE is a young technology practiced largely for research and development. Accordingly, to take advantage of the unique capabilities of the DRIE process, its etch idiosyncrasies must be determined and reconciled to render it suitable for high volume manufacturing. In practice, a difficulty of micromachining Rich's MEMS using the DRIE process has been that, even with individual etch times calculated for each semiconductor wafer, it is difficult to not overetch or underetch certain features in the wafer. Overetching a wafer typically causes significant damage to the proof mass fingers and can render the device nonfunctional, leading to a significant reduction in wafer yield. On the other hand, underetching causes undesired electrical connections that also render the device nonfunctional. Because of nonuniformities that exist in the product wafers and the highly specialized DRIE equipment. it is not unusual to have both overetched and underetched devices on wafers processed by DRIE. The interdigitated fingers of Rich's MEMS can overetch while other regions of the wafer are being etched to completion. The cause of this overetch is believed to be that, once the trenches that delineate the fingers breach the underlying cavity, the etch starts to degrade both the sides (lateral erosion) and the backside of the proof mass fingers. This phenomenon is due in part to etch lag, which as used herein refers to the reduced etch rates that are observed for narrower trenches in comparison to wider trenches. As a result, larger parasitic gaps that separate adjacent pairs of capacitively coupled fingers etch faster than the smaller capacitive gaps between paired fingers. The fact that there can be underetched and overetched die on a wafer indicates that the DRIE process window is smaller than is desirable for producing intricate MEMS devices such as Rich's.

The same etch lag and erosion phenomenon noted for Rich's MEMS device is believed to occur with essentially any suspended feature DRIE etched from a substrate above a cavity. Consequently, though the DRIE process has the capability of performing deep, high aspect ratio anisotropic etches in silicon and polysilicon, the etch lag and erosion phenomenon associated with the DRIE process complicates the ability to utilize the DRIE process in the micromachining of essentially any suspended feature (e.g., cantilever, bridge, proof mass, finger, tether, etc.) used in a wide variety of devices, such as actuators and passive circuit elements, in addition to linear and rotational motion and acceleration sensors.

SUMMARY OF THE INVENTION

The present invention provides a process for forming a microelectromechanical system (MEMS) device by a deep reactive ion etching (DRIE) process during which a substrate overlying a cavity is etched to form trenches that breach the cavity to delineate MEMS structures, including suspended elements. A particular example is the fabrication with a DRIE process of a semiconductor MEMS device used to sense motion or acceleration, and therefore includes a proof mass suspended above a cavity so as to have an axis of rotation perpendicular to the plane of the proof mass, as taught by Rich, Sparks and Zarabadi et al. While the invention will be discussed in reference to such MEMS devices, the invention is applicable to essentially any structure that can be fabricated by forming a trench in a substrate overlying a cavity.

According to the invention, the isolation of structures during the DRIE process accelerates the etch rate of such structures, possibly due to electrochemical and/or thermal influences. The present invention is directed to eliminating heat and/or charge accumulation on the structures in order to minimize or prevent an accelerated etch. As a result, DRIE processing in accordance with the present invention increases the process window by allowing slower-etching structures (e.g., structures delineated at least in part by a relatively narrower trench or trenches) to be etched to completion without overetching more rapidly etched structures (e.g., structures delineated with relatively wider trenches). The invention makes possible the use of a more reliable etch time that can account for variations that exist across a given wafer, between wafers within a lot, and between lots.

The present invention achieves the above objects with a process that entails forming a microelectromechanical device by DRIE etching a semiconductor layer having a first portion that surrounds a second portion suspended over a cavity. The DRIE process forms trenches in the semiconductor layer, some of which breach the cavity to delineate structures from the second portion of the semiconductor layer. A first of the structures remains physically in contact with the first portion of the semiconductor layer, while one or more trenches physically separate a second structure from the first structure and the first portion of the semiconductor layer. Consequently, the first structure is electrically and thermally coupled to the bulk of the semiconductor layer, while the second structure is relatively electrically and thermally isolated from the bulk of the semiconductor layer by the trenches. The invention is based on the determination that electrical and thermal isolation of a structure leads to accelerated etching of the isolated structures while other slower-etching structures are etched to completion, and as a solution provides conductive means that electrically and thermally interconnect the otherwise isolated structure (i.e., the second structure delineated by the trenches from the second portion of the semiconductor layer) with the remaining bulk (i.e., the first portion) of the semiconductor layer.

Consequently, during DRIE etching of the semiconductor layer to form the trenches that delineate the structures, heat and charge accumulation that would otherwise occur on the second structure relative to the first structure is minimized as a result of the conductive means maintaining the first and second portions of the semiconductor layer at a substantially common potential and as a result of the conductive means conducting heat from the second portion to the first portion of the semiconductor layer. After the DRIE etch. or as a result of the DRIE etch. the conductive means is interrupted (e.g. severed) to prevent undesired shorting that would otherwise occur through the conductive means.

In view of the above, it can be seen that the present invention provides a DRIE etching process by which structures of desired geometries can be more reliably and precisely formed. As a result, the present invention is able to take advantage of the deep etching capability of the DRIE process, while compensating for etch idiosyncrasies that adversely affect the structural integrity and durability of a MEMS device, so as to improve yields and device reliability.

Other objects and advantages of this invention will be better appreciated from the following detailed description.

DESCRIPTION OF THE PREFERRED EMBODIMENT

Figure 1:
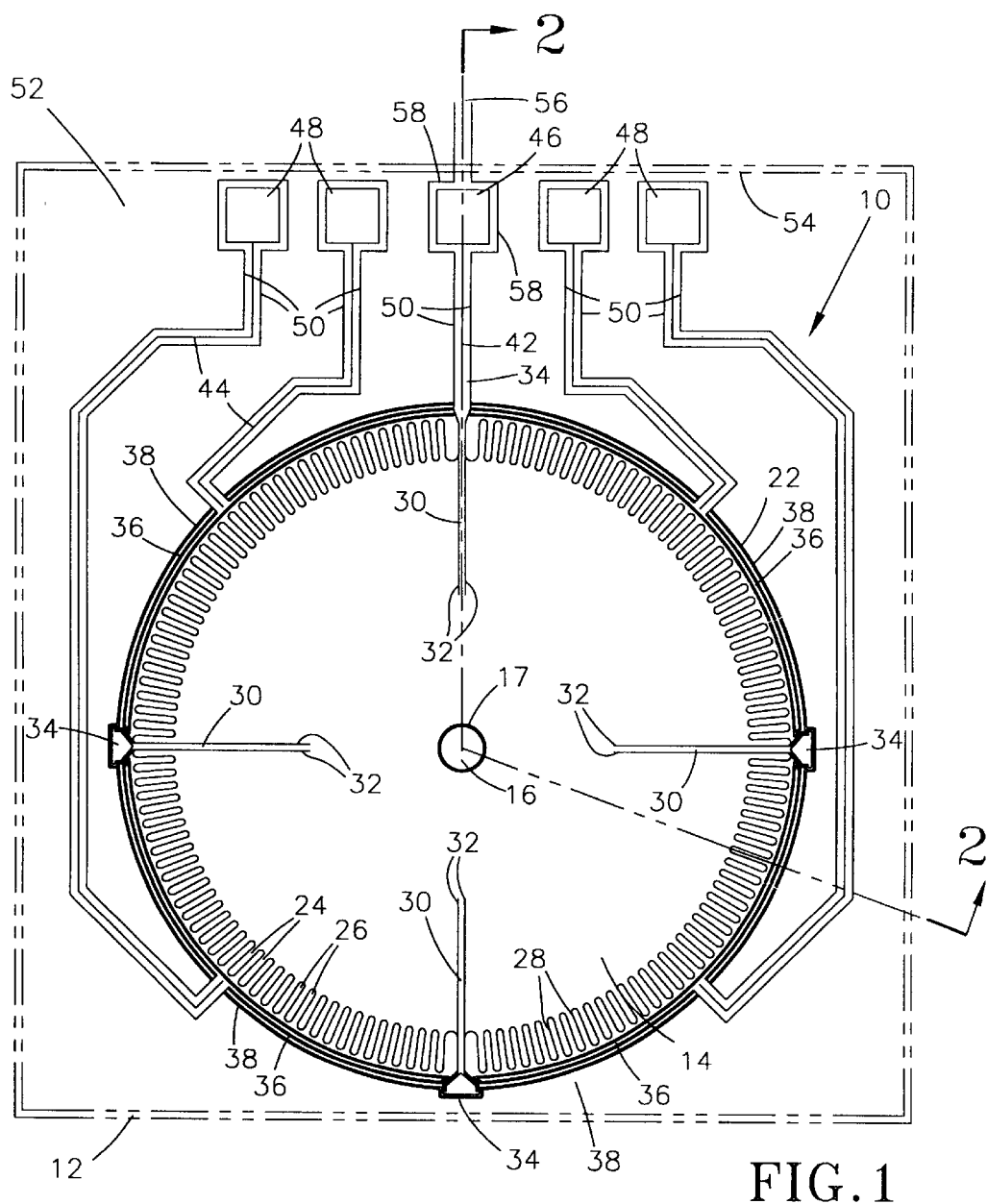
FIG. 1 is a plan view of a MEMS device in accordance with a first embodiment of this invention.
Figure 2:
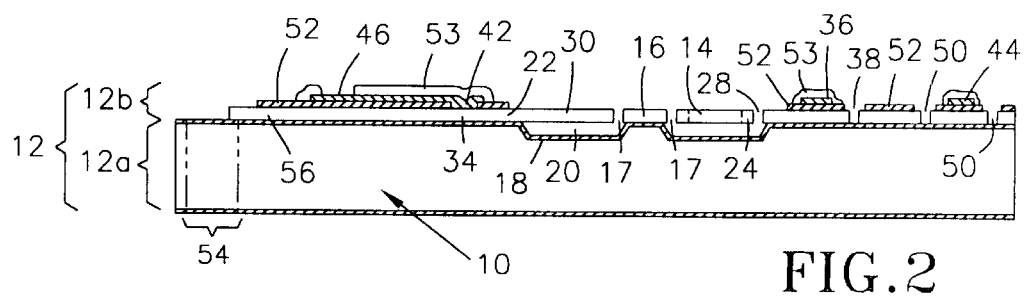
FIG. 2 is a cross-sectional view of the MEMS device of FIG 1.

FIGS. 1 and 2 represent a MEMS device 10 fabricated with a DRIE process in accordance with the present invention. The device 10 is represented as a rotational accelerometer of the type disclosed by Rich, which is incorporated herein by reference. However, those skilled in the art will appreciate that the device 10 could be employed and modified for a variety of applications. including the rate sensors taught by Sparks and Zarabadi et al. AS illustrated, the device 10 includes a proof mass 14 formed in a sensing die 12. The die 12 is shown in FIG. 2 as having a semiconductor layer 12b on a substrate 12a. A preferred material for the semiconductor layer 12b is epitaxial silicon and a preferred material for the substrate 12a is single-crystal silicon. though it is foreseeable that other materials could be used. For example. the substrate 12a could be formed of quartz, glass or any other advantageous substrate to which the semiconductor layer 12b could be bonded. In a preferred embodiment, the die 12 is processed by a known bond-etchback process, by which the substrate 12a is etched to form a cavity 20 and then oxidized to form a bond oxide layer 18 on its surface. including the cavity 20. The semiconductor layer 12b is epitaxially grown on a second wafer (not shown) and then bonded to the bond oxide layer 18, after which the second wafer is selectively removed to leave only the epitaxial layer 12b on the substrate 12a, as shown in FIG. 2. While a bond-etchback process is preferred, it is foreseeable that other techniques could be used to produce the die 12 and enclosed cavity 20 of FIG. 2.

As also seen in FIGS. 1 and 2, the proof mass 14 is defined in the semiconductor layer 12b so as to be suspended above the cavity 20 between a central hub 16 and a rim 22 formed by an outer portion of the semiconductor layer 12b. The proof mass 14 is attached to the bulk of the die 12 (through the semiconductor layer 12b) with four equiangularly-spaced tethers 30, and is completely separated from the hub 16 by a trench 17. The tethers 30 provide that the primary and desired translational mode of the proof mass 14 is rotation within the plane of the proof mass 14 about the hub 16.

As seen in FIG. 1, electrode fingers 24 radially extend outward from the proof mass 14, and are interdigitated with electrode fingers 26 that radially extend inward from the rim 22. The fingers 24 and 26 are roughly equiangularly spaced around the perimeter of the proof mass 14, and are separated by trenches 28 of alternating greater and lesser widths. Each of the narrower trenches 28 defines a capacitive gap between a pair of smooth capacitor plates defined by the pair of fingers 24 and 26 it separates. In contrast, the wider trenches 28 (which may be, for example, twice the width of the narrower trenches 28) provide parasitic gaps that separate each pair of capacitively-coupled fingers 24 and 26 from adjacent pairs of capacitively-coupled fingers 24 and 26. The capacitor plates provided by the fingers 24 and 26 are preferably large relative to the width of the narrower trench 28 therebetween, which preferably has a uniform width of, for example, about three micrometers. When a voltage potential is present between pairs of capacitively-coupled fingers 24 and 26, the rim fingers 26 capacitively sense the proximity of the proof mass fingers 24, which will vary when the proof mass 14 is subjected to rotary motion. The large number of interdigitated fingers 24 and 26 of the device 10 produce a capacitive signal that is sufficiently large to measure and manipulate.

As also shown in FIG. 1, each of the four tethers 30 extends from the interior of the proof mass 14, being separated from the proof mass 14 by trenches 32, typically on the order of about seven micrometers in width. The opposite end of each-tether 30 is anchored to an isolated portion 34 of the semiconductor layer 12b within the rim 22, thereby compliantly allowing limited rotation of the proof mass 14 relative to the rim 22. Because they provide the structural support for the proof mass 14, the tethers 30 are required to have specified widths (as measured in the plane of the proof mass 14) and thicknesses (as measured in the direction perpendicular to the plane of the proof mass 14) to achieve proper rotational compliance and prevent cross-axis and z-axis motion. The tethers 30 should also be free of nonuniformities, such as notches and other surface flaws that would weaken the tether 30, excessively increase their compliance, and provide nucleation sites for cracks.

FIG. 1 also shows the manner in which the proof mass 14 and four quadrants of the rim fingers 26 are electrically connected to metal bond pads 46 and 48, respectively, on the outer portion of the semiconductor layer 12b. The proof mass 14, along with each of its proof mass fingers 24, is electrically connected to the bond pad 46 with a single electrical connection 42, such as a metal runner or doped silicon, having one end contacting one of the tethers 30 and its opposite end contacting the bond pad 46. Other than the contact to the tether 30 (and the situation where the connection 42 is a doped surface region of the semiconductor layer 12b), the connection 42 is electrically insulated from the semiconductor layer 12b by a passivation layer 52 on the surface of the outer portion of the semiconductor layer 12b. Similarly, each quadrant of rim fingers 26 is electrically connected to one of the bond pads 48 with an electrical connection 44, with each connection 44 being coupled to its respective fingers 26 with an electrical connection 36 located along the perimeter of the rim 22 surrounding the fingers 24 and 26. The connections 36 are electrically isolated from the bulk of the semiconductor layer 12b by an isolation trench 38 that extends down through the semiconductor layer 12b to the bond oxide layer 18, as seen in FIG. 2. Likewise, the connections 42 and 44 and bond pads 46 and 48 are electrically isolated from each other and the bulk of the semiconductor layer 12b with isolation trenches 50 that are continuous along the connections 42 and 44 and around the perimeters of their respective bond pads 46 and 48. Finally, other than the bond pads 46 and 48, a second passivation layer 53 is shown as protecting the metal regions (e.g. metal runners of the connections 36, 42 and 44) of the device 10.

The die 12 in which the device 10 is formed is separated from other dies on the same wafer by a scribe line 54 (or "saw street") in accordance with conventional practice. The scribe line 54 completely surrounds the die 12, and defines the location on the wafer along which the die 12 will be sawn or otherwise singulated from the other die on the wafer. While shown in phantom in FIGS. 1, 2 and 6, the scribe line 54 is physically delineated as a trench in the surface of the wafer as shown in FIGS. 3–5 and 7–12, preferably during the same DRIE etch that delineates the features of the device 10. However, the scribe line 54 can also be delineated by other known methods.

The relative order, number, and position of the bond pads 46 and 48 are not critical to the practice of the invention. The operational requirements of the device 10 and its conditioning circuitry (not shown) will be appreciated by those skilled in the art, especially in reference to Rich, and therefore will not be discussed in any detail here. It is sufficient to say that the performance of the device 10 is generally enhanced by improving the uniformity of the fingers 24 and 26 and their capacitive gaps (formed by the narrower portions of the trenches 28) while otherwise electrically isolating the proof mass and rim fingers 24 and 26 (with the trenches 38 and 50) from the outer portion of the semiconductor layer 12b surrounding the proof mass 14. Other configurations for the device 10 are foreseeable, depending on the intended application and operating natural mode of the device.

Preferred DRIE processing of the device 10 employs a single etch to form the trenches 17, 28 and 32 that delineate the proof mass 14 and fingers 24 and 26 as well as the isolation trenches 38 and 50 that isolate the proof mass 14, proof mass fingers and the four quadrants of rim fingers 26 from each other and the bulk of the semiconductor layer 12b. (As noted above, the scribe line 54 is also preferably etched simultaneously during the DRIE etch.) As with known etching techniques, the DRIE process entails masking the surface of the die 12 to protect those surface regions of the die 12 other than the trenches 17, 28, 32,38 and 50. A suitable DRIE process for use with this invention employs an Alcatel 601 DRIE machine and a pulsed gas process in accordance with U.S. Pat. No. 6.127,273 to Laermer et al. Another suitable process employs an Alcatel 602 DRIE machine operated at a cryogenic temperature in accordance with Research Disclosure No. 42271, dated June 1999. The disclosures of Laermer et al. and Research Disclosure No. 42271 are incorporated herein by reference.

The isolation trenches 38 and 50 are typically wider than the tether trenches 32 and those portions of the trenches 28 that form the parasitic gaps between paired sets of fingers 24 and 26, and typically much wider than those portions of the trenches 28 that form the capacitive gaps between paired fingers 24 and 26. Because of the etch lag effect associated with DRIE etching, the connections 36, 42 and 44 and the bond pads 46 and 48 are isolated by the wider isolation trenches 38 and 50 before completion of the narrower trenches 28 and 32 that delineate the fingers 24 and 26 and tethers. Likewise, the tether trenches 32 and those portions of the trenches 28 that form the parasitic gaps are completed before the remainder of the trenches 28 forming the capacitive gaps. Once one of the more rapidly etched portions of the trenches 28 and 32 breach the cavity 20, the undersides of the immediately adjacent suspended structures (portions of the proof mass 14, fingers 24 and 26, and tethers 30) were found to erode, leading to unintentional thinning and lateral erosion. Significantly, the proof mass 14, proof mass fingers 24 and tethers 30 were found to be particularly susceptible to lateral erosion.

The present invention is based on the conclusion that this erosion phenomenon is promoted in part by heat buildup and the highly charged environment of the DRIE process. As the proof mass 14 becomes increasingly isolated from the remainder of the semiconductor layer 12b as a result of the trenches 17, 28 and 32 breaching the cavity 20, heat transfer from the proof mass 14 to the bulk of the die 12 decreases, resulting in a temperature increase of the proof mass 14 and proof mass fingers 24 that may increase the etching rate. Similarly, the opportunity for charge build-up in the MEMS device 10 shown in the Figures is great, with static build-up resulting in uneven charge levels in different active and passive regions within the die 12. In particular, a charge build-up is likely to occur in the proof mass 14 and its fingers 24 as compared to the rim fingers 26 and the surrounding outer portion of the semiconductor layer 12b (including the rim 22), particularly as the proof mass 14 becomes increasingly free from the remainder of the semiconductor layer 12b as the trenches 17, 28 and 32 are completed. It was shown that once one of the more rapidly etched trenches (e.g. the hub and tether trenches 17 and 32) breaches the cavity 20, the anisotropic nature of DRIE etching may cause highly directional and highly energetic physical etchant species to be reflected by the floor of the cavity 20 onto the sides and undersides of the immediately adjacent suspended structures (portions of the proof mass 14, fingers 24 and 26, and tethers 30), causing backside and lateral erosion of these structures that leads to unintentional thinning. The lateral surfaces and backsides of the proof mass fingers 24, especially near the distal ends of the fingers 24, have been observed to be particularly prone to erosion from energetic etch species reflection from the walls and floor of the cavity 20. Also observed with the proof mass fingers 24 is notching beneath the etch mask, possibly promoted as a result of surface charging. Static charges may also produce notches and surface flaws elsewhere on the suspended structures of the device 10. Finally, the tendency for overetching is exacerbated by thickness variations across the wafer and between wafers being simultaneously processed. The end result is that the proof mass finger profile and thickness can be detrimentally affected to the extent that the fingers 24 are too compliant or may even fall off, drastically increasing process yield loss.

The present invention addresses the above defects by eliminating or at least significantly reducing the charge and heat buildup in the proof mass 14 and its fingers 24 during the DRIE process. This aspect of the invention is accomplished by electrically and/or thermally tying the proof mass 14 to the outer portion of the semiconductor layer 12b, to the substrate 12a, or to one or more quadrants of rim fingers 26. Surprisingly, tying one or more quadrants of rim fingers 26 to the outer portion of the semiconductor layer 12b or the substrate 12a has also been shown to reduce etching defects on the proof mass 14 and its fingers 24. A suitable feature for accomplishing the above is an electrically and/or thermally conductive connection between two or more of the bond pads 46 and 48 and the semiconductor layer 12b. An electrical connection from the proof mass 14 to the rim fingers 26 or the bulk semiconductor layer 12b would affect the electrical testability of the device 10. For example, an electrical connection between the proof mass 14 to any one of the individual rim finger quadrants would eliminate the ability to test the capacitance between the proof mass fingers 24 and the rim fingers 26 of that quadrant, though the capacitance between the proof mass 14 and the remaining quadrants would be possible. Additionally, an electrical connection of the proof mass 14 to the bulk semiconductor layer 12b would result in additional parasitic capacitance during capacitive testing of all rim finger quadrants of the device 10. The ability to perform a wafer test is a significant process advantage. Therefore. in certain embodiments of the invention. the connections are configured in such a way as to have little or no affect on the testability of the wafer. Finally, because connections capable of electrically tying the proof mass 14 to the semiconductor layer 12b or rim fingers 26 cannot remain for proper operation of the device, several methods for interrupting or breaking the connection after or during the DRIE process are provided. Suitable techniques utilize the die separation or singulation operation, the etch lag phenomenon, and metal/silicon fuses. More than one of these techniques can be used to break the connection.

Figure 3:
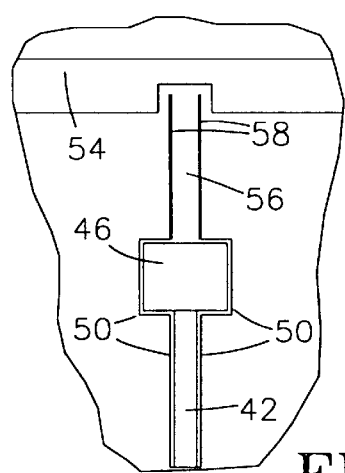
FIG. 3 is a detailed plan view of an additional connection between the proof mass and bulk semiconductor of the MEMS device of FIG. 1 in accordance with the first embodiment of this invention.

FIGS. 1, 2 and 3 illustrate a first embodiment by which the proof mass 14 is both electrically and thermally connected to the bulk semiconductor layer 12b with a silicon connection 56 in order to dissipate any charge and excessive heat that might otherwise accumulate on the proof mass 14 and its fingers 24, a result of which would be overetching of the proof mass fingers 24. While shown as a portion of the semiconductor layer 12b, the additional connection 56 could be a metal or polysilicon runner on the surface of the passivation layer 52 or the semiconductor layer 12b. In addition, though the connection 56 is shown as tying the proof mass bond pad 46 to the semiconductor layer 12b, one of the rim finger bond pads 48 could be provided with a connection of this type to tie one quadrant of the rim fingers 26 to the bulk semiconductor layer 12b.

The additional connection 56 extends from the proof mass bond pad 46 into the scribe line 54 (in FIG. 3, the passivation layers 52 and 53 are omitted for clarity). An isolation trench 58 that extends down through the semiconductor layer 12b to the oxide layer 18 is concurrently etched with the trenches 17, 28, 32, 38 and 50. The trench 58 electrically isolates all but the last few micrometers or so of the connection 56 from the semiconductor layer 12b. However, the trench 58 is narrower than the other trenches, so as to be subject to etch lag. As previously discussed, etch lag is a phenomenon that occurs in DRIE processes, and is characterized by narrower trenches etching at a lower rate than wider trenches. Consequently, the present invention makes use of etch lag as a means of maintaining an electrical and thermal path between the connection 56 and the bulk of the semiconductor layer 12b throughout the DRIE release process. More particularly, in addition to the contact between the connection 56 and semiconductor layer 12b at the end of the connection 56 (within the scribe line 54), a portion of the semiconductor layer 12b remains at the bottom of the trench 58 to electrically and thermally connect the proof mass 14 and its fingers 24 to the bulk of the semiconductor layer 12b throughout that portion of the DRIE process. during which the much wider trenches 38 and 50 are etched to completion to isolate the connections 36, 42 and 44 and bond pads 46 and 48, followed by the trenches 17, 28 and 32 which are etched to completion to delineate the proof mass 14. fingers 24 and 26, and tethers 30. At the completion of the etch, the trench 58 extends completely through the semiconductor layer 12b to the oxide layer 18 so that. other than at the end of the connection 56 projecting into the scribe line 54, the proof mass 14 and fingers 24 are electrically isolated from the four quadrants of rim fingers 26 by the finger trench 28 and the trench 50 surrounding the connection 42 and bond pad 46, as well as the trench 58 surrounding the connection 56. However, the electrical and thermal path provided by the connection 56 and the portion of the semiconductor layer 12b at the bottom of the trench 58 substantially minimizes and potentially prevents the accelerated backside and lateral erosion that would Be occur on suspended structures delineated by a trench (e.g., 17, 28 or 32) that has breached the cavity 20 before other (narrower) trenches were completed.

Although there may be a capacitive shift due to the additional connection to the semiconductor layer 1 2b, the device 10 can still be tested at wafer level. Thereafter, the contact between the connection 56 and semiconductor layer 12b at the end of the connection 56 (within the scribe line 54) is eliminated as the die 12 is separated from the wafer along the scribe line 54, such as during wafer saw. Once the wafer is sawn into individual die, the connection 56 has no electrical effect on the performance of the device 10. This result is guaranteed by the placement of the connection 56 in the scribe line 54.

Figure 4:
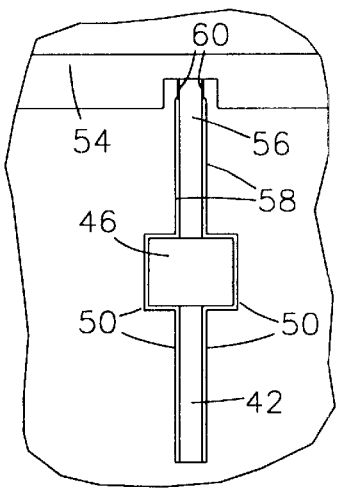
FIGS. 4 and 5 are plan and perspective views, respectively, of an alternative additional connection for the MEMS device of FIG. 1, showing a wafer scribe line delineated simultaneously with the additional connection.
Figure 5:
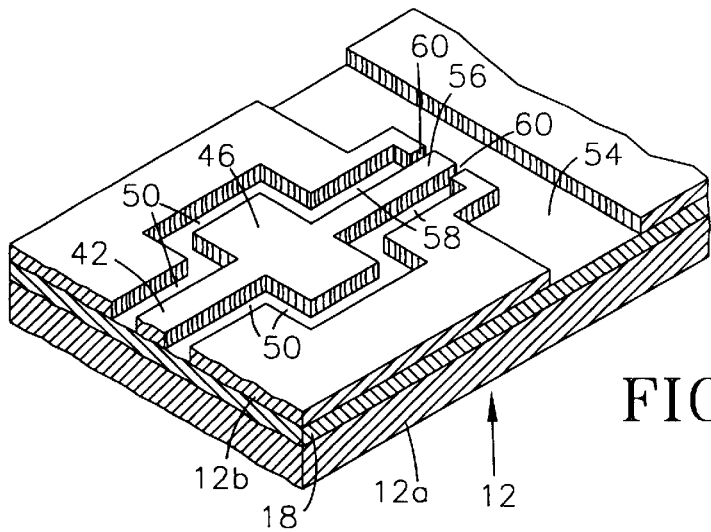
Figure 6:
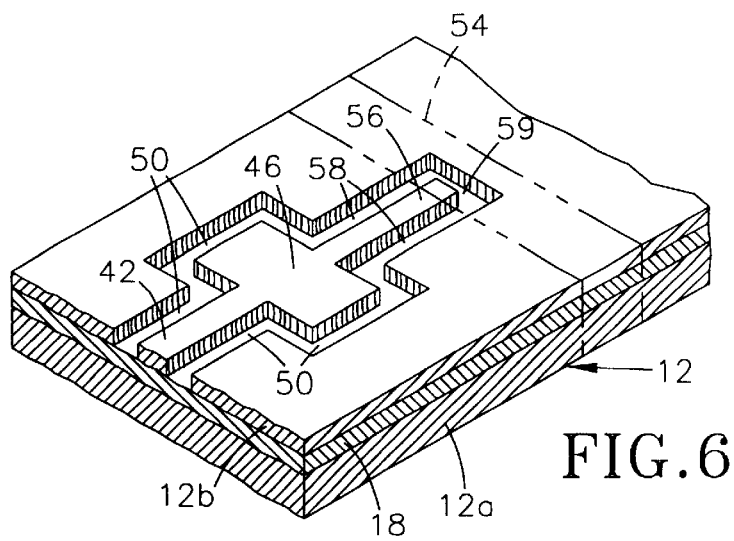
FIG. 6 is a perspective view corresponding to FIG. 5, wherein the wafer scribe line is not delineated simultaneously with the additional connection.

FIGS. 4 and 5 represent a modification of the device 10 shown in FIGS. 1 through 3, by including a still narrower trench 60 that enters the scribe line 54 (delineated simultaneously during the DRIE etch) to break the connection 56 as a result of the etch lag phenomenon. FIG. 6 represents a similar modification to that of FIGS. 4 and 5, but in the situation where the scribe line 54 is not etched simultaneously with the trenches 50 and 58, necessitating that a narrower trench 59 interconnect the trenches 58 within the surface of the wafer in which the scribe line 54 will be later formed. Consequently, the embodiments of FIGS. 4, 5 and 6 again make use of etch lag, this time as a means of breaking the electrical connection 56 at the very end of the DRIE release process by forming the trench 59 or 60 across the final few micrometers of the connection 56. The trenches 59 and 60 are narrower than the other trenches 17, 28, 32, 38, 50 and 58 so that they will etch to completion. thereby breaking the connection 56 to the semiconductor layer 12b, after the other trenches 17, 28, 32, 38, 50 and 58 and the structures they delineate are completed. For example, if the narrowest of the remaining trenches is the finger trench 28 having a width of about two micrometers, forming the trench 59/60 to have a width of approximately 1.2 micrometers will ensure that the trench 59/60 will not be completed until after delineation of the fingers 24 and 26, at which time the proof mass 14 will become electrically isolated from the bulk semiconductor layer 12b. While the connection 56 exists, electrical charge and heat that would otherwise build up in the proof mass 14 are dispersed to the semiconductor layer 12b. By sizing the trench 59/60 to be sufficiently narrower than the finger trench 28, a complete etch of the fingers 24 and 26 as well as some degree of overetch can be performed to account for variations within the wafer and from wafer to wafer.

The embodiments of FIGS. 4, 5 and 6 provide a redundant isolation step, because the wafer saw process will also cut through the area where the connection 56 was placed. Breaking the connection 56 with the etch lag allows for wafer level testing without any changes in the testing setup or readings for the device 10 that would exist in the absence of the connection 56. The placement of the connection 56 in the scribe line 54 guarantees that the connection 56 will be broken during the wafer saw process. As with FIG. 3, the connection 56 could be made between any one quadrant of the rim fingers 26 and the bulk semiconductor layer 12b.

Figure 7:
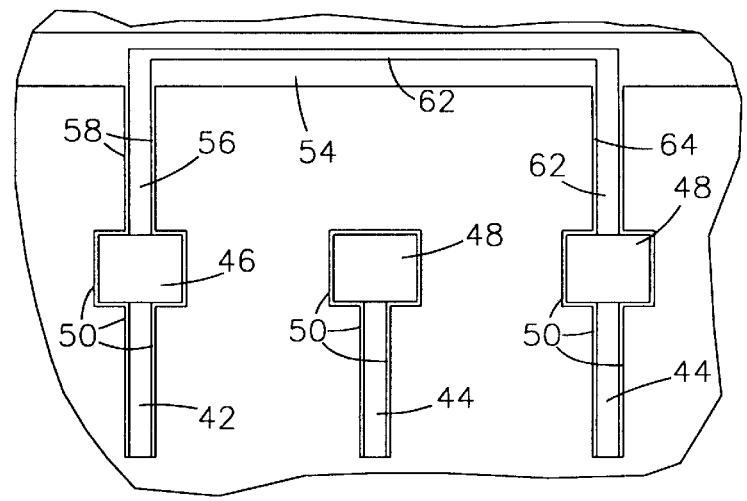
FIGS. 7 through 12 are plan views of other alternative additional connections for the MEMS device of FIG. 1.
Figure 8:
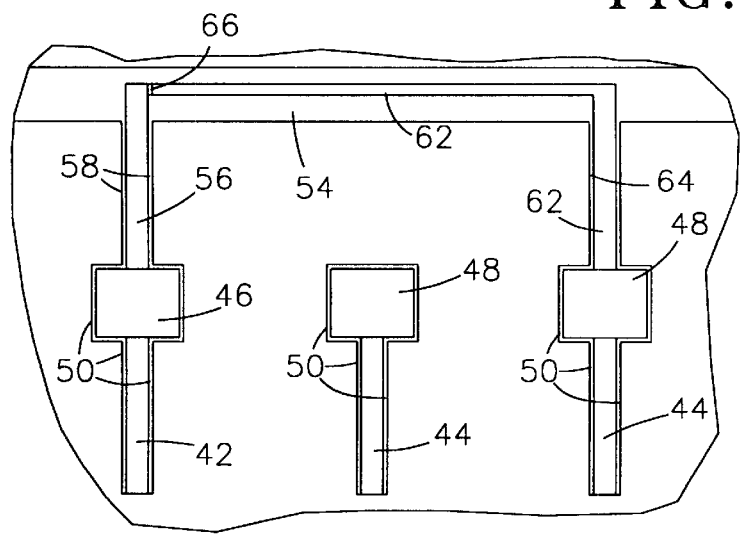

As discussed above, overetching of the proof mass fingers 24 can also be prevented by tying the proof mass fingers 24 to the rim fingers 26 of any of the four quadrants. This embodiment of the invention is represented in FIGS. 7 and 8, which illustrate two techniques for providing an electrical and thermal connection between the proof mass bond pad 46 and one of the rim finger bond pads 48, corresponding to one quadrant of the rim fingers 26. An electrical connection 62 is shown as extending from the connection 56 of the proof mass bond pad 46, through the scribe line 54, and then to one of the rim finger bond pads 48 to complete the electrical and thermal connection between the proof mass 14 to the rim fingers 26 associated with the bond pad 48. Between the scribe line 54 and the pad 48, the connection 62 is isolated from the semiconductor layer 12b by isolation trenches 64. As before, the connection 62 is intended to exist throughout that portion of the DRIE process during which the fingers 24 and 26 are delineated by the trenches 28, so that backside erosion of the fingers 24 is reduced and, as a result, the DRIE process window is increased. However, the testability of the device 10 is reduced because the capacitance between the proof mass fingers 24 and the rim fingers 26 of the bond pad 48 to which the connection 62 is made will not be testable before wafer saw. However, the other quadrants of rim fingers 26 will be testable at wafer test through the remaining three rim finger bond pads 48, which is both possible and an effective manner to test the device 10.

Similar to the embodiment of FIGS. 4 and 5, the embodiment of FIG. 8 offers the advantage of an additional isolation trench 66 that will break the connection 62 at the end of the DRIE process. As before, the trench 66 is patterned to be narrower than the minimum capacitive gap (formed by the narrower portions of the trench 28), so that the isolation trench 66 etches slowest.

Figure 9:
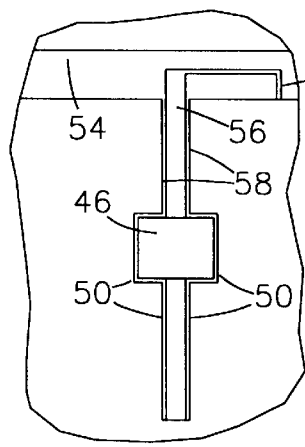

FIG. 9 illustrates an alternative modification of the electrical connection 56 through the inclusion of a fuse 68 as the final electrical connection to the bulk semiconductor layer 12b. The fuse 68 may consist of epitaxial silicon, a combination of metal and epitaxial silicon, or metal only. The fuse 68 is intended to be blown by an appropriate level of current at the completion of the DRIE process but prior to wafer test. The process of etching the finger trenches 28 can be utilized to undercut the fuse 68 (with the scribe line 54 etch) to reduce its width, thereby reducing the current necessary to blow the fuse 68. The fuse 68 preferably extends into the scribe line 54 as shown to allow the wafer saw process to provide redundant means for breaking the connection 56. Though indicated as connecting the proof mass bond pad 46 to the semiconductor layer 12b, the fuse 68 can be used to connect any one of the rim finger bond pads 48 to the bulk semiconductor layer 12b. Alternatively, a series of silicon fuses (not shown) could also be used to connect the proof mass bond pad 46 to an individual or group of rim finger bond pads 48. With these alternative embodiments, the fuse or fuses 68 could be placed in the scribe line 54 as shown in FIG. 9, or located between bond pads 46 and 48, foregoing the redundant saw isolation feature.

The ability to perform a wafer test is a significant advantage to wafer processing. In FIGS. 3 and 4, the connection 56 between the proof mass bond pad 46 and the semiconductor layer 12b (or to one or more of the rim finger bond pads 48) may introduce an amount of parasitic capacitance into the wafer test. It would typically be advantageous to reduce or eliminate any additional silicon from the testing or operation of the device 10. For this purpose, the embodiments represented in FIGS. 10, 11 and 12 seek to reduce the amount of bulk semiconductor layer 12b that is introduced into the wafer level testing.

Figure 10:
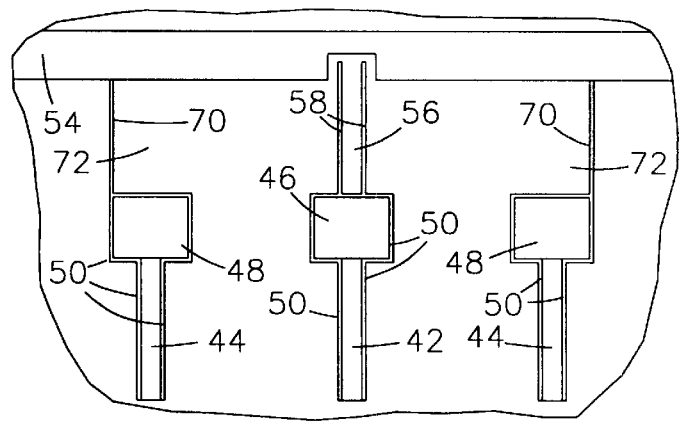

FIG. 10 illustrates the connection 56 of FIGS. 1 through 4, with the addition of two isolation trenches 70 that extend into the etched scribe line 54 from the isolation trenches 50 of the two adjacent rim finger bond pads 48. During the initial part of the DRIE etch in which the finger trenches 28 are formed, the proof mass bond pad 46 is connected to the entire bulk semiconductor layer 12b of the device 10. As the finger trench etch progresses, a limited area 72 of the semiconductor layer 12b between the two additional isolation trenches 70 will remain connected to the proof mass bond pad 46 through the connection 56. However, the remainder of the bulk semiconductor layer 12b will become electrically isolated from the proof mass bond pad 46 as a result of the additional isolation trenches 70. Accordingly, the embodiment of FIG. 10 has the advantage of an initially large amount of contact with the semiconductor layer 12b, followed by completion of the trenches 70 and continued contact to the semiconductor layer 12b, but now through the much smaller area 72 of the semiconductor layer 12b during the balance of the DRIE etch process. During any intentional overetch of the fingers 24 and 26, the advantage of some electrical connection between the proof mass 14 and the semiconductor layer 12b is retained throughout the DRIE process, while the undesired affects at wafer test is minimized due to the limited area 72 of the semiconductor layer 12b to which the proof mass 14 remains electrically connected. As with the previous embodiments, die separation by wafer saw or another suitable operation will break the connection 56 between the proof mass bond pad 46 and the smaller area 72 of the semiconductor layer 12b.

Figure 11:
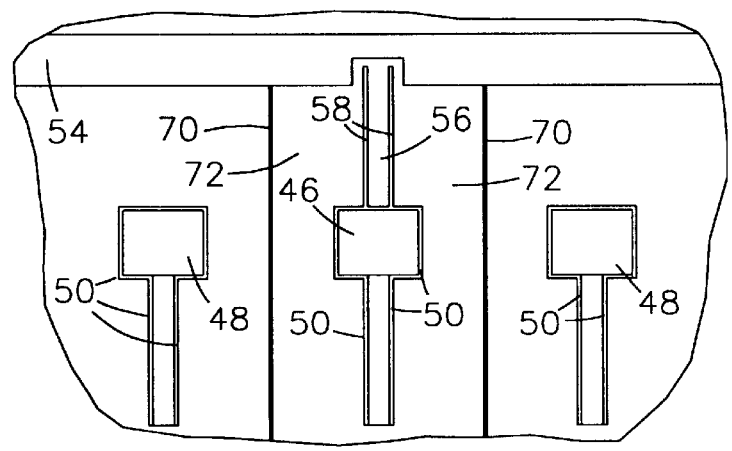

The embodiment illustrated in FIG. 11 seeks to reduce further the effects of electrical contact to the bulk semiconductor layer 12b on wafer level testing by relocating the additional trenches 70 to the semiconductor layer 12b between the proof mass bond pad 46 and its adjacent rim finger bond pads 48. As a result, the area 72 that remains connected to the bulk semiconductor layer 12b is further limited to the two narrower strips on each side of the electrical connection 56 to the proof mass bond pad 46. Either embodiment of FIG. 10 or 11 could be applied to one of the rim finger bond pads 48 instead of the proof mass bond pad 46.

Figure 12:
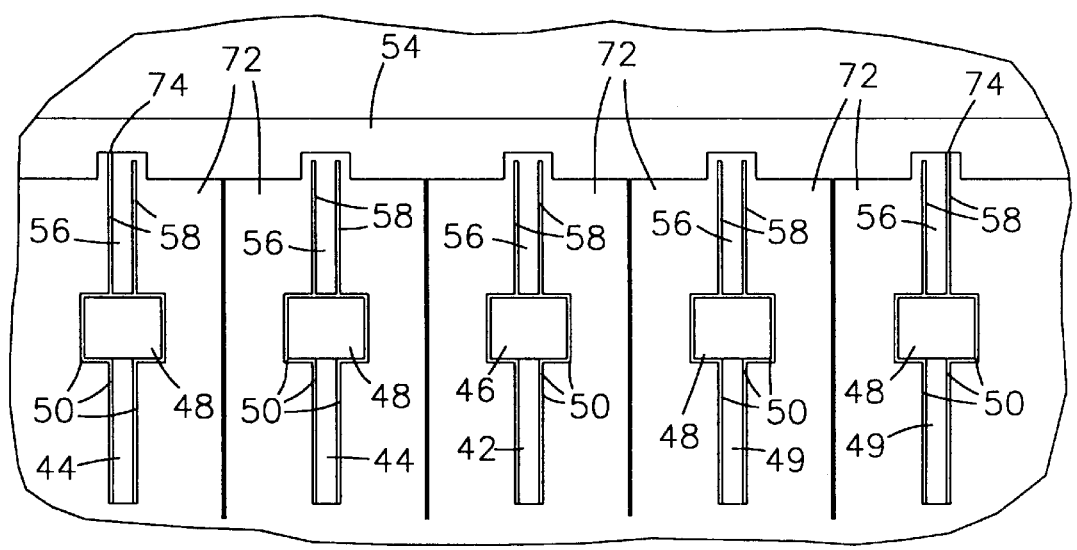

Finally, FIG. 12 illustrates the embodiment of FIGS. 1 through 4 further modified by forming the electrical connection 56 between each bond pad 46 and 48 and the semiconductor layer 12b, and then isolating each connection 56 with additional isolation trenches 70 in the manner similar to that illustrated in FIG. 11. In FIG. 12, as the finger trench etch progresses, the bond pads 46 and 48 are eventually isolated from each other once the trenches 70 etch through the semiconductor layer 12b. The width of the trenches 70 is preferably smaller than the minimum width of the trenches 17, 28 and 38 that delineate the proof mass 14 and fingers 24 and 26 of the device 10 to allow the etch lag phenomenon to provide a natural means of isolating the electrical elements of the device 10 after the fingers 24 and 26 have been formed. Also shown in FIG. 12 are two isolation trenches 74 that extend from the outermost trenches 58 of the outermost bond pads 48 through the end of their corresponding connections 56, such that these trenches 74 will completely break the electrical connections 56 to the bulk of the semiconductor layer 12b outside of the limited areas 72 between the trenches 70. As a result, at the end of the finger trench etch, the proof mass 14 (and its fingers 24) and the rim fingers 26 will be isolated from each other except for the limited semiconductor areas 72 proximate to the individual bond pads 46 and 48. This feature allows the advantage of the electrical connections 56 to extend into the overetch portion of the finger trench etch, while the effects at wafer test are minimized by restricting the connections to the limited areas 72. The connections 56 are then completely broken at wafer saw as a result of the electrical contact between the semiconductor layer 12b and the connections 56 being located in the scribe line 54.

Those skilled in the art will appreciate that conventional silicon processing techniques and materials can and would be employed in the fabrication of a MEMS device, beyond those discussed above. In addition, while a particular configuration is shown for the proof mass 14, fingers 24 and 26 and tethers 30, various modifications could be made by one skilled in the art. The present invention can also incorporate several additional methods to bring all device electrodes to a common potential and to increase the quality of the connections 56. For example, a chuck with which the wafer is mounted for the DRIE process can provide electrical connections to the bond pads 46 and 48 and the die 12 to bring all device electrodes to the chuck potential. In addition, highly doped surface regions could be formed on the proof mass 14 and the connections 56 to reduce the electrical resistivity of the connections for any of the embodiments of this invention. Finally, it is foreseeable that the present invention could be utilized to encompass a multitude of applications through the addition or substitution of other processing or sensing technologies. Therefore, while the invention has been described in terms of a preferred embodiment, other forms could be adopted by one skilled in the art. Accordingly, the scope of the invention is to be limited only by the following claims.

What is claimed is:

1. A process of forming, a microelectromechanical device by deep reactive ion etching a semiconductor layer, the semiconductor layer having a first portion that surrounds a second portion suspended over a cavity, the deep reactive ion etching being conducted to form trenches in the semiconductor layer that breach the cavity to delineate first and second structures from the second portion of the semiconductor layer, the trenches physically separating the second structure from the first portion of the semiconductor layer while the first structure physically contacts the first portion of the semiconductor layer, the process comprising the steps of:

providing conductive means that electrically and thermally interconnects the first and second portions of the semiconductor layer;

deep reactive ion etching the semiconductor layer to form the trenches that delineate the first and second structures, during which heat and charge accumulation on the second structure relative to the first structure is minimized as a result of the conductive means maintaining the first and second portions of the semiconductor layer at a substantially common potential and as a result of the conductive means conducting heat from the second portion to the first portion of the semiconductor layer; and then interrupting the conductive means to prevent thermal and electrical conduction through the conductive means between the first and second portions of the semiconductor layer.

2. The process according to claim 1, wherein the trenches have different widths, and wherein relatively wider trenches etch more rapidly during the etching step than relatively narrower trenches so that the wider trenches breach the cavity before the narrower trenches during the deep reactive ion etching step.

3. The process according to claim 1, wherein the second structure comprises a proof mass delineated from the second portion of the semiconductor layer by at least one of the trenches so as to be supported above the cavity, and wherein the first portion of the semiconductor layer defines a rim that surrounds the proof mass and the cavity.

4. The process according to claim 3, wherein the first structure comprises one of a first plurality of fingers projecting from the rim, the second structure further comprises one of a second plurality of fingers projecting from the proof mass. and the first and second plurality of fingers are interdigitized.

5. The process according to claim 1. wherein the conductive means electrically and thermally interconnects the second structure to the first portion of the semiconductor layer and does not electrically or thermally interconnect the second structure to the first structure during the deep reactive ion etching step.

6. The process according to claim 1, wherein the conductive means electrically and thermally interconnects the first and second structures to the first portion of the semiconductor layer during the deep reactive ion etching step.

7. The process according to claim 1, wherein the conductive means electrically and thermally interconnects the first and second structures during the deep reactive ion etching step.

8. The process according to claim 1, wherein the conductive means is a metal runner that contacts the first portion of the semiconductor layer during the deep reactive ion etching step.

9. The process according to claim 1, wherein the conductive means comprises a fuse that electrically interconnects the second structure to the first portion of the semiconductor layer during the deep reactive ion etching step.

10. The process according to claim 9, wherein the step of interrupting the conductive means comprises passing a current through the conductive means to blow the fuse after the deep reactive ion etching step.

11. The process according to claim 1, wherein the step of interrupting the conductive means comprises sawing through the conductive means during a die separation operation following the deep reactive ion etching step.

12. The process according to claim 1, wherein the step of interrupting the conductive means comprises severing the conductive means with an additional trench formed in the first portion of the semiconductor layer during the deep reactive ion etching step.

13. The process according to claim 12, wherein the additional trench is narrower than any of the trenches that delineate the first and second structures, and the additional trench severs the conductive means after completion of the trenches that delineate the first and second structures.

14. The process according to claim 1, wherein the etching step further comprises defining isolation trenches that limit the conductive means to electrically and thermally connecting the second portion of the semiconductor layer at a limited region of the first portion of the semiconductor layer.

15. A process of forming a microelectromechanical device by deep reactive ion etching a semiconductor layer on a substrate, the semiconductor layer having a first portion on the substrate, a second portion suspended over a cavity between the semiconductor layer and the substrate, a rim defined by the first portion and surrounding the cavity, and a scribe line surrounding the first portion, the deep reactive ion etching being conducted to form first and second trenches in the first and second portions, respectively, of the semiconductor layer, the first trenches extending through the first portion of the semiconductor layer, the second trenches extending through the second portion and breaching the cavity to delineate multiple suspended structures from the second portion, the multiple suspended structures comprising a proof mass supported within the cavity so as to have an axis of rotation perpendicular to the semiconductor layer, first fingers cantilevered radially inward from the rim and capacitively coupled with second fingers cantilevered radially outward from the proof mass, and tethers suspended between and interconnecting the proof mass and the rim, the second trenches physically separating the proof mass and the second fingers from the first fingers and the first portion of the semiconductor layer, the first portion of the semiconductor layer further comprising a dielectric layer on a surface thereof, bond pads on the dielectric layer, a first electrical connection on the dielectric layer and electrically interconnecting the first fingers with a first of the bond pads, a second electrical connection on the dielectric layer and electrically interconnecting the proof mass and the second fingers with a second of the bond pads, the first trenches and the dielectric layer electrically isolating the first and second bond pads and the first and second electrical connections from the first portion of the semiconductor layer. the process comprising the steps of:

providing conductive means that electrically and thermally interconnects the second bond pad with at least one of the first bond pad and the first portion of the semiconductor layer and therefore electrically and thermally interconnects the proof mass and the second fingers with at least one of the first bond pads and the first portion of the semiconductor layer;

deep reactive ion etching the semiconductor layer to form the first and second trenches, during which heat and charge accumulation on the proof mass and the second fingers relative to the first portion of the semiconductor layer is minimized as a result of the conductive means maintaining the proof mass, the first and second fingers, and the first portion of the semiconductor layer at a substantially common potential and as a result of the conductive means conducting heat from the proof mass and the second fingers to the first portion of the semiconductor layer; and then interrupting the conductive means to prevent thermal and electrical conduction through the conductive means.

16. The process according to claim 15, wherein the second trenches comprise relatively wider and narrower trenches and the wider second trenches etch more rapidly during the etching step than the narrower second trenches so that the wider second trenches breach the cavity before the narrower second trenches during the deep reactive ion etching step.

17. The process according to claim 15, wherein the conductive means electrically and thermally interconnects the proof mass and the second fingers to the first portion of the semiconductor layer and does not electrically or thermally interconnect the proof mass and the second fingers to the first fingers during the deep reactive ion etching step.

18. The process according to claim 15, wherein the conductive means electrically and thermally interconnects the proof mass and the first and second fingers to the first portion of the semiconductor layer during the deep reactive ion etching step.

19. The process according to claim 15, wherein the conductive means electrically and thermally interconnects the proof mass and the second fingers with the first fingers during the deep reactive ion etching step.

20. The process according to claim 15, wherein the conductive means is a metal runner that contacts the second bond pad and the first portion of the semiconductor layer during the deep reactive ion etching step.

21. The process according to claim 15, wherein the conductive means comprises a fuse that electrically interconnects the proof mass and the second fingers to the first portion of the semiconductor layer during the deep reactive ion etching step.

22. The process according to claim 21, wherein the step of interrupting the conductive means comprises passing a current through the conductive means to blow the fuse after the deep reactive ion etching step.

23. The process according to claim 15, wherein the step of interrupting the conductive means comprises sawing through the conductive means during a die separation operation following the deep reactive ion etching step.

24. The process according to claim 15, wherein the step of interrupting the conductive means comprises severing the conductive means with a third trench formed in the first portion of the semiconductor layer during the deep reactive ion etching step.

25. The process according to claim 24, wherein the third trench is narrower than any of the first and second trenches and severs the conductive means after completion of the first and second trenches.

26. The process according to claim 15, wherein the etching step comprises defining isolation trenches that limit the conductive means to electrically and thermally connecting the proof mass and the second fingers to a limited region of the first portion of the semiconductor layer.

27. A microelectromechanical device comprising:

a substrate having a cavity formed therein;

a semiconductor layer on the substrate, the semiconductor layer having a first portion surrounding the cavity so as to define a rim surrounding the cavity, the semiconductor layer having a second portion over the cavity so as to be surrounded by the rim;

a scribe line surrounding the first portion of the semiconductor layer;

first trenches extending through the first portion of the semiconductor layer to the substrate;

second trenches extending through the second portion of the semiconductor layer and breaching the cavity to delineate a proof mass supported over the cavity, first fingers cantilevered radially inward from the rim toward the proof mass, second fingers cantilevered radially outward from the proof mass toward the rim and interdigitized with the first fingers, and tethers interconnecting the proof mass and the rim, the proof mass having an axis of rotation perpendicular to the semiconductor layer, the second trenches physically separating the proof mass and the second fingers from the first fingers and the first portion of the semiconductor layer;

a dielectric layer on a surface of the first portion of the semiconductor layer;

first and second bond pads on the dielectric layer;

a first electrical connection on the dielectric layer and electrically interconnecting the first fingers with the first bond pad, and a second electrical connection on the dielectric layer and electrically interconnecting the proof mass and the second fingers with the second bond pad; and conductive means that electrically and thermally interconnect the second bond pad with at least one of the first bond pad and the first portion of the semiconductor layer and therefore electrically and thermally interconnects the proof mass and the second fingers with at least one of the first bond pad and the first portion of the semiconductor layer;

wherein, except for the conductive means, the first and second bond pads and the first and second electrical connections are electrically isolated by the first trenches and the dielectric layer from the first portion of the semiconductor layer.

28. The microelectromechanical device according to claim 27, wherein the conductive means electrically and thermally contacts the first portion of the semiconductor layer at the scribe line.

29. The microelectromechanical device according to claim 27, wherein the conductive means electrically and thermally interconnects the proof mass and the second fingers to the first portion of the semiconductor layer and does not electrically or thermally interconnect the proof mass and the second fingers to the first fingers.

30. The microelectromechanical device according to claim 27, wherein the conductive means electrically and thermally interconnects the proof mass and the first and second fingers to the first portion of the semiconductor layer.

31. The microelectromechanical device according to claim 27, wherein the conductive means electrically and thermally interconnects the proof mass and the second fingers with the first fingers.

32. The microelectromechanical device according to claim 27, wherein the conductive means is a metal runner that contacts the second bond pad and the first portion of the semiconductor layer.

33. The microelectromechanical device according to claim 27, wherein the conductive means comprises a fuse that electrically interconnects the proof mass and the second fingers to the first portion of the semiconductor layer.

34. The microelectromechanical device according to claim 27, further comprising isolation trenches that limit the conductive means to electrically and thermally connecting the proof mass and the second fingers to a limited region of the first portion of the semiconductor layer.

* * * * *